United States Patent [19]
Osawa

[11] Patent Number: 5,820,367
[45] Date of Patent: Oct. 13, 1998

[54] BOAT FOR HEAT TREATMENT

[75] Inventor: Tetsu Osawa, Sagamihara, Japan

[73] Assignee: Tokyo Electron Limited, Tokyo-to, Japan

[21] Appl. No.: 715,241

[22] Filed: Sep. 18, 1996

[30] Foreign Application Priority Data

Sep. 20, 1995 [JP] Japan ................................. 7-266531

[51] Int. Cl.⁶ .................................................. F27D 5/00
[52] U.S. Cl. .......................... 432/253; 432/152; 432/5; 432/241
[58] Field of Search ............................ 432/5, 11, 241, 432/253, 152

[56] References Cited

U.S. PATENT DOCUMENTS

| | | | |
|---|---|---|---|
| 5,310,339 | 5/1994 | Ushikawa | 432/253 |
| 5,458,688 | 10/1995 | Watanabe | 118/728 |
| 5,482,558 | 1/1996 | Watanabe et al. | 432/245 |
| 5,605,574 | 2/1997 | Tsunashima et al. | 118/728 |
| 5,626,680 | 5/1997 | Porter et al. | 118/728 |

FOREIGN PATENT DOCUMENTS

3-263823  11/1991  Japan .
4-144124  5/1992  Japan .

Primary Examiner—Teresa J. Walberg
Assistant Examiner—Gregory A. Wilson
Attorney, Agent, or Firm—Beveridge, DeGrandi, Weilacher & Young, LLP

[57] ABSTRACT

Support members are provided in a vertically spaced relation on a plurality of upright columns. A wafer support member comprises a projection formed to be annular along an inner peripheral edge of a ring and an outer wall formed along an outer peripheral edge thereof. The wafer is positively supported at a position inwardly of the outer peripheral edge thereof by the projection of the wafer support member despite the presence or absence of a warp thereof. Therefore, a load caused by the weight of the wafer is dispersed over the entire projection of the wafer support member. This suppresses the concentration of stress on a specific portion of the wafer support portion, and a surface defect called a slip generated when the wafer is heat treated can be eliminated.

4 Claims, 10 Drawing Sheets

BOAT FOR HEAT TREATMENT

BACKGROUND OF THE INVENTION

The present invention relates to a boat (wafer boat) for heat treatment used in a vertical type heat treatment apparatus (a heat treatment furnace) for heat treating a substrate to be processed such as a semiconductor wafer.

As one production process for a semiconductor wafer (hereinafter referred to as a wafer), there is a process for heat treating the wafer at a high temperature in order to effect formation of an oxide film, diffusion of a dopant and the like thereon.

In the vertical type heat treatment apparatus for the heat treatment process, a number of wafers are loaded on a boat for heat treatment at vertically fixed intervals to apply fixed heat treatment to the wafers. In such a boat for heat treatment as described above, in the past, a number of support grooves are formed in four upright columns, and the wafers are held by the support grooves whereby the wafers are loaded on the boat so as to support four points of an outer peripheral edge of the wafer.

Figure 9:
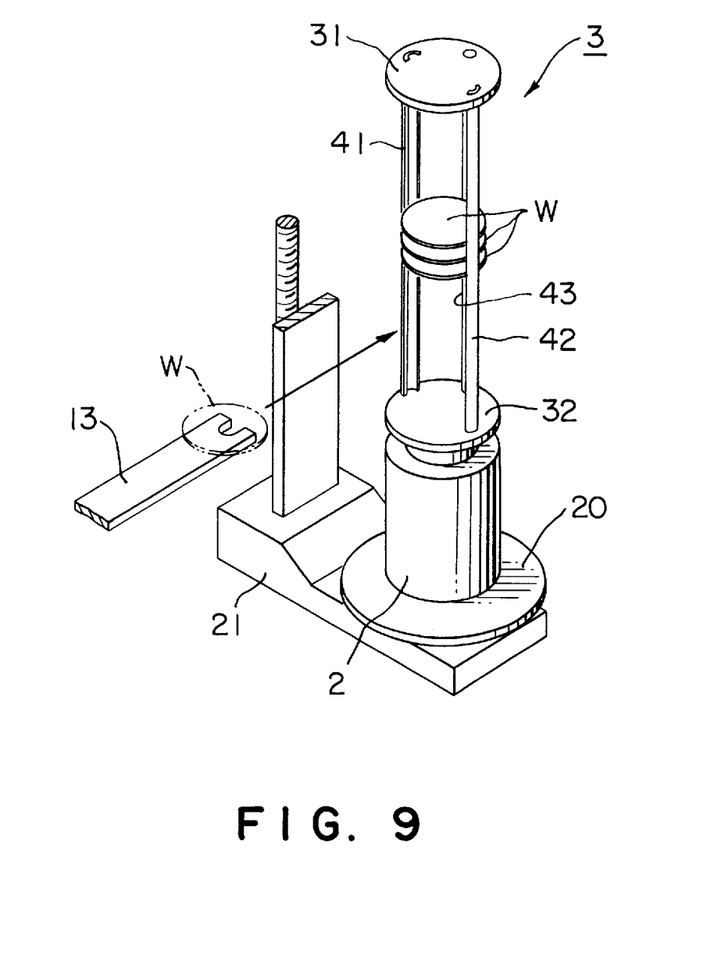
FIG. 9 is a perspective view of a conventional boat for heat treatment.

However, a wafer boat for supporting three points of an outer peripheral edge of a wafer has been developed for the reasons described later. FIG. 9 shows a boat for heat treatment 3 of a three-point support type. The boat for heat treatment 3 is provided on a heat insulating cylinder 2 used for heat insulating, three columns 41, 42 and 43 formed of, for example, quartz, are stood upright between circular top plate 31 and bottom plate 32 arranged at upper and lower portions parallel to each other, and support grooves for supporting lower surfaces of outer peripheral edges of wafers W are formed in these columns 41, 42 and 43. In the figure, reference numeral 13 designates a wafer carrying arm, which moves in a direction as indicated by an arrow so as to load the wafer W.

The three-point support is superior to the four-point support. This will be briefly mentioned in connection with support. This will be briefly mentioned in connection with the slip phenomenon during the heat treatment. In the heat treatment process for wafers, the wafer is sometimes heated for a long period of time at a high temperature of approximately 1,200° C. in order to diffuse the injected dopant (impurity ion) to a fixed depth after ions have been injected into the wafer, for example. In the case where a material for the wafer is silicon, since a melting point of silicon is 1,410° C., a yield stress of the silicon wafer is extremely small under the heating temperature of 1,200° C.

On the other hand, with the recent trend toward a larger diameter of a wafer, the size thereof starts to shift from 6 to 8 inch. The shifting of the size to 12 inch has been currently studied. When the wafer becomes larger in diameter, when the heat treatment is carried out at a temperature close to a melting point of the material for the wafer as mentioned above, a crystal defect called a slip tends to occur in the wafer in the vicinity of a place supported by the columns of the wafer boat for heat treatment. This slip is a fine fault that is hardly visible, which fault can be seen through a magnifier or a microscope. It is presumed that the slip occurs in the wafer due to 1̂ the internal stress resulting from the weight of the wafer, and 2̂ the thermal strain stress caused by the uneven in-plane temperature (temperature difference) of the wafer.

On the other hand, in the case where the wafer is supported by the four-point support, a warp within a standard value and a warp caused by a temperature distribution during heating occur in the wafer. Since there is an error in fabrication when support grooves of the columns are processed, there occurs a phenomenon that one support point out of four support points of the wafer is disengaged so that the support points of the wafer become three points. At this time, since loads of the support points become unbalanced due to the arrangement of the columns, the load caused by the weight of the wafer is applied to only one support point so that an excessively large stress is concentrated, and as a result, the slip tends to occur.

In the boat for heat treatment 3 of the three-point support type shown in FIG. 9, the wafer W is supported at three points which correspond to positions substantially equally divided into three in the circumferential direction whereby even if the wafer W is warped, the wafer W is evenly supported positively by the columns. This provides an advantage that the load caused by the own weight of the wafer W can be dispersed to prevent the stress from being concentrated on one support point.

Figure 10:
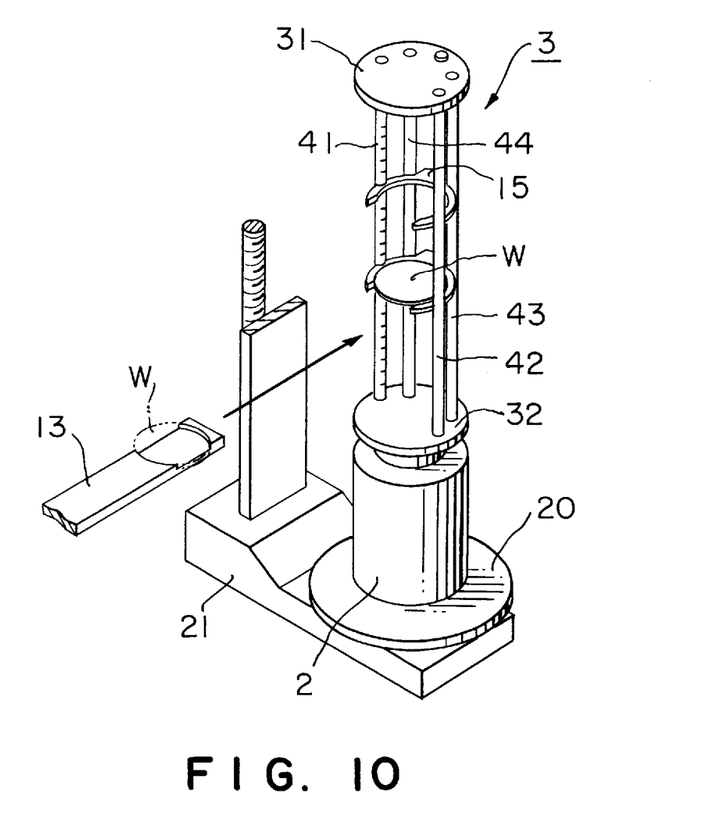
FIG. 10 is a perspective view of a further conventional boat for heat treatment.
Figure 11:
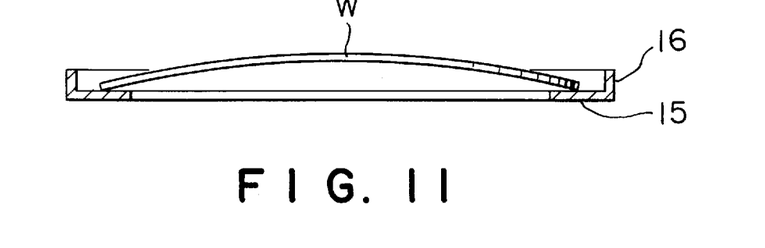
FIG. 11 is a longitudinal sectional view showing the state in which a wafer is supported by a support member of the conventional boat for heat treatment.

On the other hand, other than the construction in which the wafer is supported in the support grooves, there is used a boat for heat treatment 3 in which a ring-like support member 15 provided with a flat support surface is arranged on columns 41, 42, 43 and 44 stood upright to place the wafer W thereon, as shown in FIG. 10. In this wafer boat for heat treatment 3, the outer peripheral edge of the wafer W is supported in face contact by the support member 15. Thereby, the internal stress caused by the own weight of the wafer W in the vicinity of the support place is relieved as compared with the case where the wafer W is supported at four points whereby even if the wafer W is warped, since the support surface is wide, it is possible to prevent a large load from being applied to only one place. Further, a heat shielding wall portion 16 is provided in the outer peripheral edge of the support member 15 as shown in FIG. 11 to prevent overheat on the outer peripheral edge of the wafer W to suppress generation of the thermal strain stress.

However, in the boat for heat treatment in which the wafer W is supported at three points, the own weight of the wafer is dispersed to three support portions but the wafer is supported merely by three places of the outer peripheral edge. Therefore, the wafer W becomes extremely large in aperture, for example, 12 inch in size, the own weight and the diameter of the wafer is considerably large. Therefore, the outer peripheral edge of the wafer W supports a considerably large moment according to the weight of the wafer W inwardly of the support point so that the stress in the vicinity of the support point becomes excessively large. Further, when the wafer is caused to rise in temperature, the heat is moved in and out of the wafer via the columns of the wafer boat for heat treatment. Therefore, a difference in temperature between the center and the peripheral edge of the wafer occurs to generate the thermal strain stress, by the sum total of which the slip possibly occurs in the wafer as a result.

On the other hand, in the boat for heat treatment 3 in which the wafer W is supported by the ring-like support member 15, the overheat of the outer peripheral edge of the wafer W is prevented by the wall 16 of the support member 15 to suppress the generation of the thermal strain stress, and the outer peripheral edge of the wafer W and the area slightly inwardly thereof are supported in face contact by the flat support surface. It is contemplated therefore that the stress generated in the wafer W is small as compared with the case where the outer peripheral edge of the wafer W is supported at three points or four points. However, the support point of the wafer W sometimes is moved to the outer peripheral portion, as shown in FIG. 11, due to the warp of the wafer W and the difference in precision of the processing of the support member 15.

Figure 12:
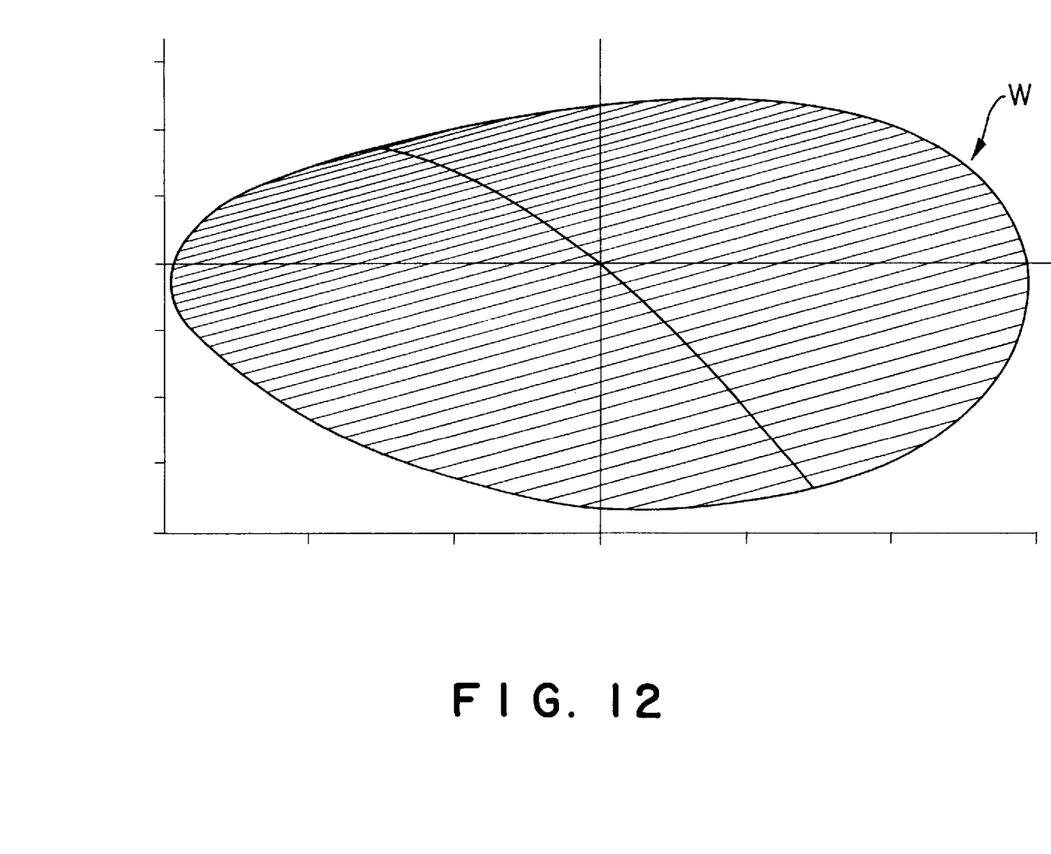
FIG. 12 is a perspective view showing the state in which the wafer supported by the support member shown in FIG. 11 is curved.

FIG. 12 is a perspective view showing the state in which the wafer W is curved. If a deformation occurs in the wafer as just mentioned, particularly, the movement of the support point as shown in FIG. 11 occurs. When this support point moves, the contact surface between the support member 15 and the wafer becomes small. In the wafer W having an extremely large aperture, say, 12 inch, a large moment is supported by the outer peripheral edge of the wafer W as previously mentioned so that the stress is concentrated on the portion in contact with the support member 15, and after all, the slip in the wafer unavoidably occurred.

SUMMARY OF THE INVENTION

The present invention has been made under these circumstances. The object of the present invention is to provide a boat for heat treatment capable of reducing an occurrence of a slip as small as possible when a substrate to be processed is heat treated.

The present invention provides a boat for heat treatment in which support members are provided in a vertically spaced relation on a plurality of upright columns, a substrate to be processed is supported on these support members to carry it into and out of a vertical type heat treatment furnace, wherein an upwardly projecting projection is provided at a position where the support members support a part inwardly of an outer peripheral edge of the substrate to be processed, and the substrate to be processed is evenly supported by the projection.

DETAILED DESCRIPTION OF THE PREFERRED EMBODIMENTS

Figure 1:
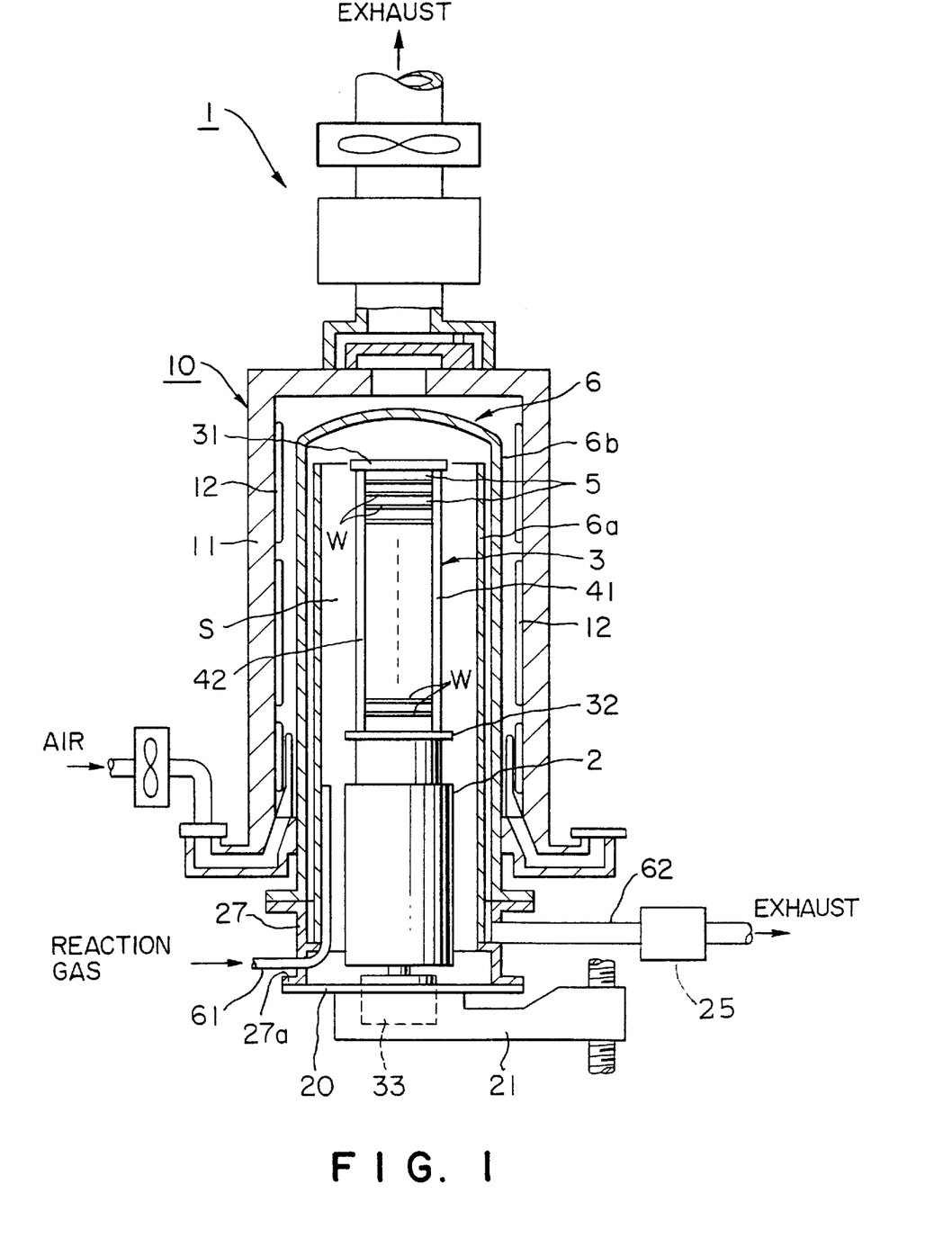
FIG. 1 is an explanatory view schematically showing a longitudinal section of a vertical type heat treatment apparatus to which a boat for heat treatment of the present invention is applied.

An embodiment of the boat for heat treatment according to the present invention will be described hereinafter with reference to the accompanying drawings. FIG. 1 schematically shows a longitudinal section of the entire vertical type heat treatment apparatus for fast thermal processing (FTP) to which the boat for heat treatment according to the present embodiment is applied. In the present embodiment, a reaction space S constructed so as to apply heat treatment to a substrate to be processed is formed internally of a reaction tube 6, which reaction tube 6 itself is formed into a double tube by a substantially tubular inner tube 6a formed, for example, of quartz, and an outer tube 6b whose upper end is closed in the form of a dome.

A heating portion 10 for raising a temperature of the interior of the reaction space S to a fixed temperature is arranged around the reaction tube 6. The heating portion 10 is constituted by the arrangement of a plurality of heating blocks provided on the inner peripheral surface of a heat insulating body 11 in a peripherally warped manner while suitably bending a resistance heat generating wire 12. The resistance heat generating wire 12 can be formed, for example, of MoSi2 (molybdenum disilicate). In this case, the reaction space S in the reaction tube 6 can be subjected to the fast thermal processing at 50° to 100° C./min.

As shown in FIG. 1, the reaction tube 6 is hermetically joined to and supported on a metal manifold 27 formed, for example, of stainless steel, secured to a base plate (not shown), through, for example, an O-ring (not shown). A gas supply tube 61 connected to a gas supply source 61 for supplying a fixed reaction gas into the reaction tube 6 extends through the side wall of the manifold 27. The gas supply tube 61 further extends into the inner tube 6a of the reaction tube 6 and bends upward, and a supply port formed at the extreme end thereof is located in the vicinity of the lower end of the wafer boat 3.

An exhaust tube 62 with exhaust means 25 such as a turbo-molecular pump is connected to the manifold 27 so that the reaction space S in the reaction tube 6 can be vacuumed to set and maintain the interior thereof at a fixed reduction degree.

Further, the manifold 27 is formed with a flange portion 27a at a peripheral edge of an opening at the lower end thereof. The flange portion 27a and a lid 20 provided on a lift 21 are placed in close contact with each other by the upward movement of the lift 21 to thereby close the interior of the reaction tube 6.

A substrate to be processed or a wafer W is loaded on the wafer boat 3 and moved up and down by the lift 21 so that the wafer W is loaded on and unloaded from the reaction space S in the reaction tube 6.

More specifically, the lift 21 is provided with a rotation drive mechanism 33, a heat insulating tube 2 is provided on the upper surface of a turn table freely rotated by the rotation drive mechanism 33, and the wafer boat 3 for loading the wafer W is arranged on the heat insulating tube 2. The boat for heat treatment 3 in this embodiment is used for heat treatment of a substrate to be processed or a wafer. In the following, the boat for heat treatment and the support member will be called a wafer boat and a wafer support member, respectively.

Figure 2:
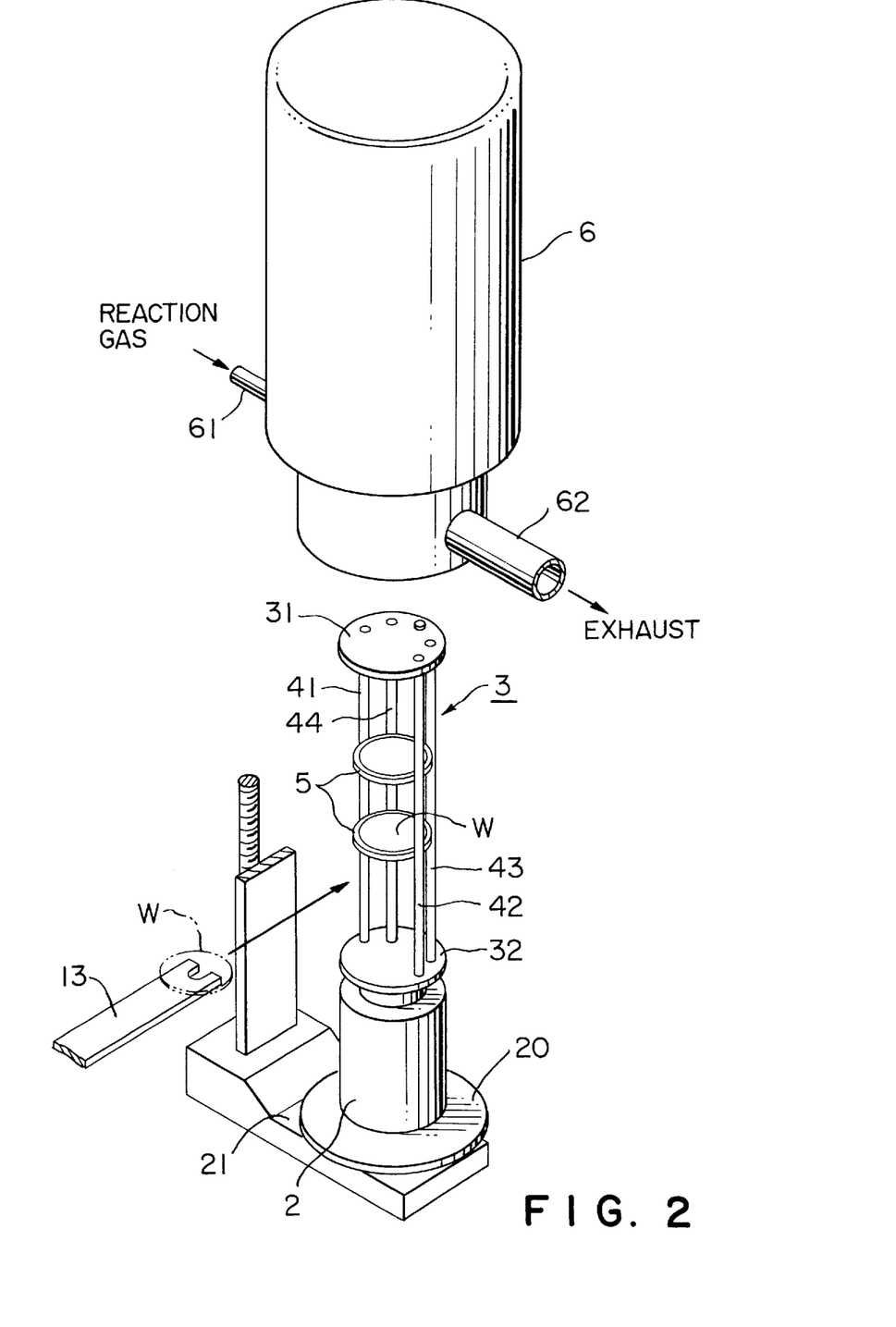
FIG. 2 is a perspective view of the boat for heat treatment according to the present invention.

As shown in FIG. 2, the wafer boat 3 is provided with a top plate 31 and a bottom plate 32, which are circular and formed, for example, of SiC, arranged opposedly and parallel with each other at upper and lower portions, and four columns 41 to 44, which are formed, for example, of SiC or polysilicon, are stood upright and secured therebetween. These columns are arranged in a positional relation such that out of these columns 41 to 44, two columns 41 and 42 support left and right positions this side in a carrying-in direction (indicated by an arrow in the figure) of the wafer W described later, and the remaining two columns 43 and 44 support left and right positions deep side in a carrying-in direction of the wafer W.

Figure 3A:
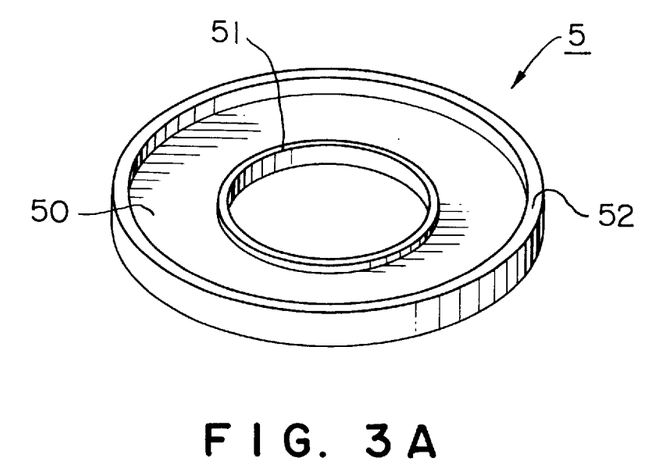
FIGS. 3A and 3B are a perspective view and a cross-sectional view, respectively, of a wafer support member of the boat for heat treatment shown in FIG. 2.
Figure 3B:
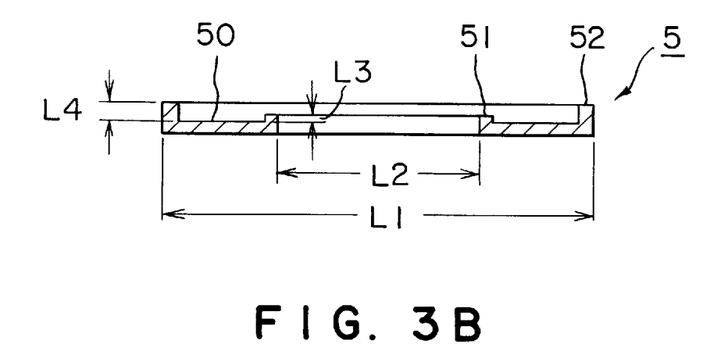

Between the top plate 31 and the bottom plate 32 of the wafer boat 3 are arranged for example 150 wafer support members 5 in parallel with one another in a vertically spaced relation. Material for these support members 5 used is for example, polysilicon, in the case where the wafer W is a silicon wafer. Each of the wafer support members 5 has a shape such that it is formed on the upper surface of a ring 50 with an annular projection 51 upwardly projected along the inner peripheral edge and a wall 52 is formed on the outer peripheral edge of the ring 50, as shown in FIGS. 3A and 3B. The size of the wafer support member 5 is such that an outside diameter (inside diameter of the wall) L1 of the ring 50 is larger than the outside diameter of the wafer W, and an inside diameter (inside diameter of the projection 51) L2 of the ring 50 is set to the size so that when the wafer W is processed to be shifted, which will be described later, a thrust mechanism can pass through the internal space of the projection 51. For example, in the case where the wafer W of 12 inch is supported, L1 and L2 are set to approximately 310 mm and 150 mm, respectively.

Figure 4:
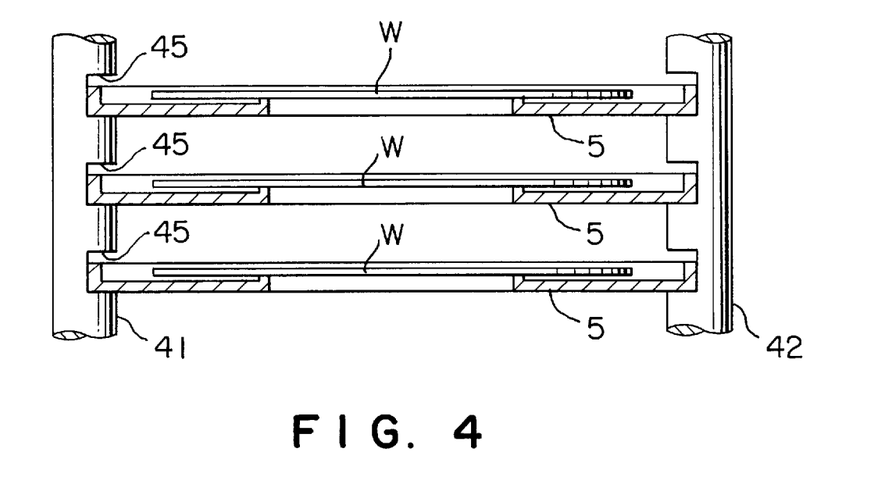
FIG. 4 is a fragmentary longitudinal sectional view of the boat for heat treatment shown in FIG. 2.

Further, in the case where the wafer W of 12 inch, for example, is supported, the height L3 of the projection 51 shown in FIG. 3 is set to approximately 0.3 to 0.4 mm so that even if the wafer W has a warp, the outer peripheral edge of the wafer W is not in contact with the ring 50. The height L4 of the wall 52 is set, for example, to approximately 1.5 mm so that when the wafer W is supported on the projection 51, the wall 52 is at a position not higher than the upper surface of the wafer W. These wafer support members 5 are mounted on the columns 41 to 44 so that the outer peripheral edges thereof are inserted into four grooves 45 provided in the columns 41 to 44, held horizontally on the bottoms of the grooves 45 and come in contact with the sides of the grooves 45, as shown in FIG. 4.

As shown in FIG. 2, the wafer boat 3 of the present invention constructed as described above is detachably mounted on the heat insulating tube 2 provided at the lower part with the flange 20, the heat insulating tube 2 being placed on the boat elevator 21. A vertical type furnace 6 is arranged upwardly of the wafer boat 3.

Next, the operation of the wafer boat 3 according to the present invention will be described. First, the delivery of the wafers W to the wafer boat 3 is carried out in the area separated from the heat treatment area. At this time, the thrust mechanism (not shown) is moved up so that it passes through the internal space of the projection 51 of the wafer support member 5, and the wafer W is once placed on the thrust mechanism by the carrying arm 13. The thrust mechanism is then moved down to deliver the wafer W onto the projection 51 of the wafer support member 5. At this time, the part inwardly of the peripheral edge of the wafer W is placed in face contact with the upper surface of the projection 51 of the wafer support member 5 (see FIG. 4).

Such a delivery as described above is sequentially carried out, for example, from the upper stage toward the bottom stage a set (for example, 50) of wafers W are loaded on the wafer boat 3, the wafer boat 3 is transferred onto the heat insulating tube 2 on the boat elevator 21. The boat elevator 21 is moved up to load the wafers W into the vertical type furnace 6. In the case where the wafers W are heat treated at a heating temperature of, for example, 1,200° C., the vertical type furnace 6 is preheated to, for example, approximately 800° C., and after the wafers W are loaded, the temperature is raised to approximately 1,200° C. for fixed heat treatment. Thereafter, the boat elevator 21 is moved down, the wafers W are unloaded from the vertical furnace 6, and the wafer boat 3 is transferred to the separate area where the wafers W are sequentially taken out of the wafer boat 3 by the operation reversed to that mentioned above.

According to the mode of operation as described above, if the wafers W are free from warping, the wafer W comes in contact with the upper surface of the projection 51 of the wafer support member 5 at the position inwardly of the outer peripheral edge thereof so that the wafer W is supported by the entire contact surface. Therefore, the load caused by the own weight of the wafer W is evenly dispersed to the entire contact surface. Since the wafer W is supported at the position inwardly of the outer peripheral edge thereof, a moment is smaller than that of the case where the wafer W is supported at the outer peripheral edge, and therefore, the stress caused by the load at the support point is small. As a result, a large load is not applied to one place of the wafer W to concentrate an excessively large stress, and the cause of occurrence of the slip in the wafer W can be reduced.

Figure 5A:
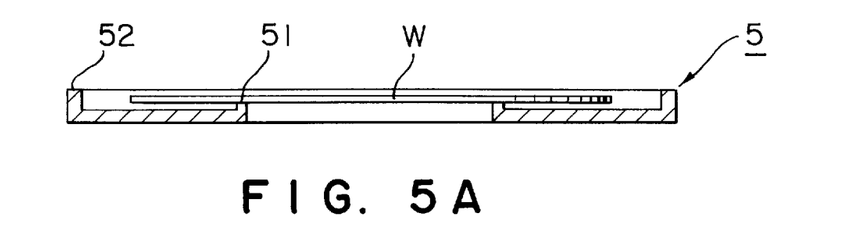
FIGS. 5A and 5B are respectively longitudinal sectional views showing the state in which a wafer is supported on the wafer support member shown in FIG. 3.
Figure 5B:
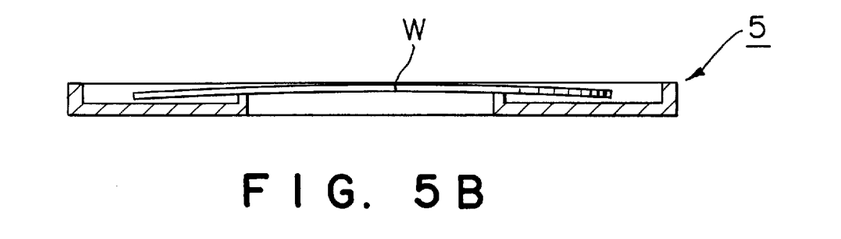

The height of the projections 51 is set in consideration of the warp of the wafer W as mentioned above. Therefore, even if the wafer W is curved as shown in FIG. 12, the wafer W is positively supported at the position inwardly of the outer peripheral edge thereof by the projection 51 of the wafer support member 5, as shown in projection 51 of the wafer support member 5, as shown in FIG. 5B. Thus, the outer peripheral edge of the wafer W does not come in contact with the wafer support member 5 so that the contact point constitutes a support point. Therefore, since in this case, an excessively large load is not applied to one place of the wafer W, the concentration of excessively large stress on one place is suppressed to reduce the cause of occurrence of the slip in the wafer.

Further, since the wall 52 is provided on the outer peripheral edge of the wafer support member, as shown in FIGS. 3A and 3B, heat rays directly incident on the peripheral edge of the wafer W are shielded by the wall 52 to prevent the temperature in the peripheral edge of the wafer W from being excessively raised. Because of this, a temperature difference between the center portion and the peripheral portion of the wafer W is small so that the occurrence of the thermal strain stress can be suppressed. As a result, it is possible to prevent the concentration of stress and to considerably reduce the cause of occurrence of the slip in the wafer.

Figure 6A:
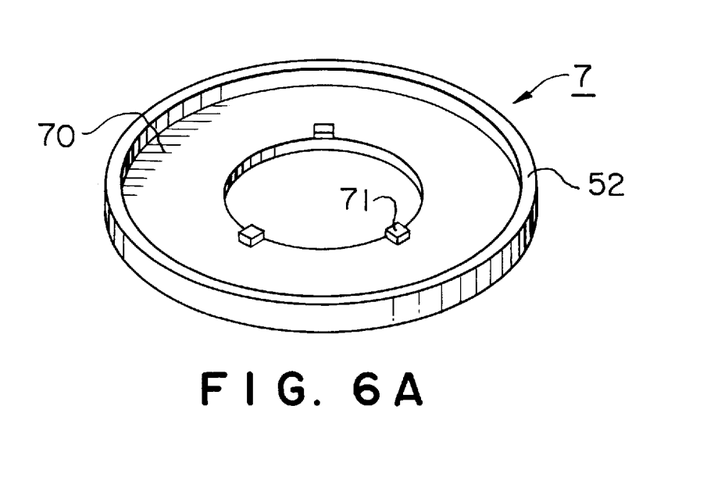
FIGS. 6A to 6C are respectively perspective views showing a further embodiment of the wafer support member shown in FIG. 3.
Figure 6B:
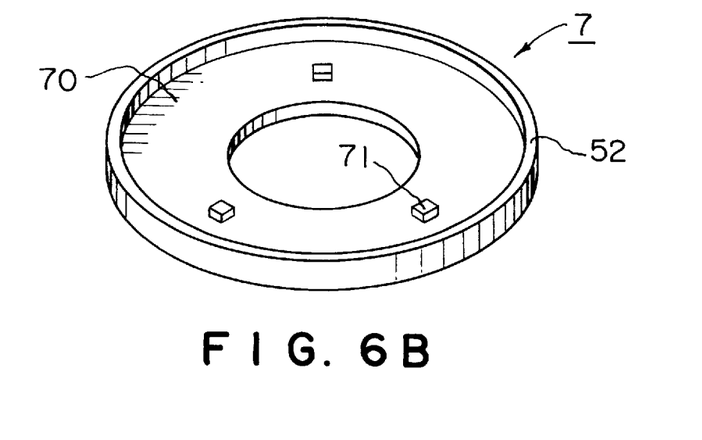
Figure 6C:
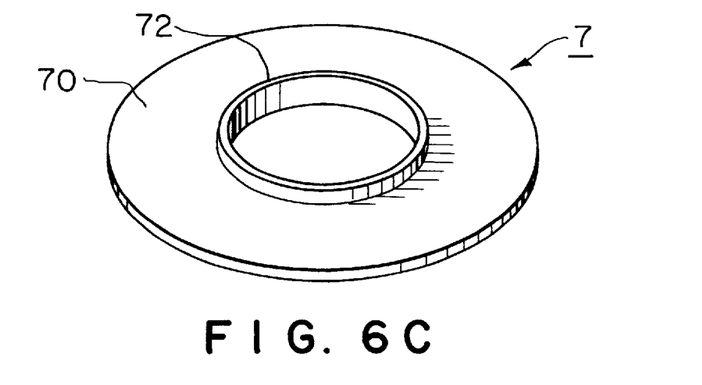

Another embodiment of the wafer support member will be described hereinafter. In the wafer support member 7 shown in FIG. 6A, three projections 71 are provided at locations equally divided into three in the peripheral direction of the upper surface of the inner peripheral edge of a ring 70, in place of the annular projection shown in FIG. 3. Alternatively, the projections 71 for three-point support may be provided at positions inwardly of the wafer outer peripheral edge of the upper surface of the ring 70, for example, at substantially intermediate positions between the inner peripheral edge and the outer peripheral edge of the ring 70, as shown in an example of the three-point support in FIG. 6B, for example. Further, in the wafer support member 7, the wall 52 is not always necessary, and as shown in an example of an annular projection shown in FIG. 6C, the wall is not provided on the outer peripheral edge but a projection 72 may be provided only in the inner peripheral edge of the ring.

Figure 7A:
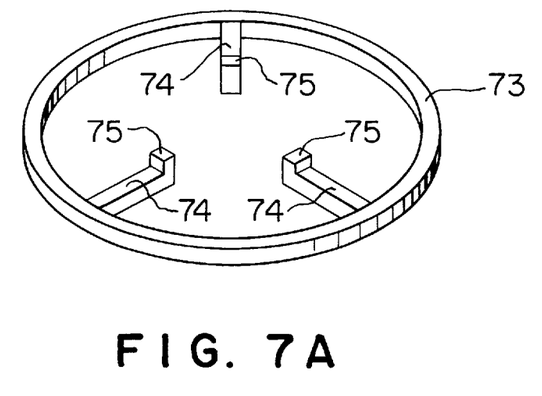
FIGS. 7A to 7B are respectively perspective views showing another embodiment of the wafer support member shown in FIG. 3.
Figure 7B:
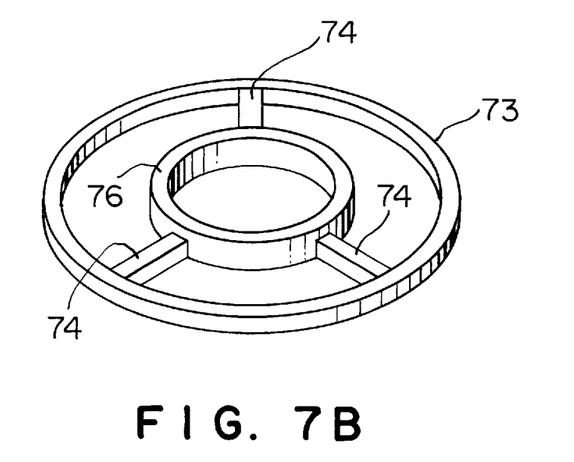

Alternatively, as the wafer support member, three support rods 74 which extend inwardly from positions equally divided into three (at an open angle of 120°) in a peripheral direction are provided on a narrow ring 73, and projections 75 are provided at the extreme ends thereof, as shown in FIG. 7A. Further, as shown in FIG. 7B, an annular projection 76 in place of the projections 75 for the three-point support may be connected to a ring 73 by support rods 74.

Figure 8:
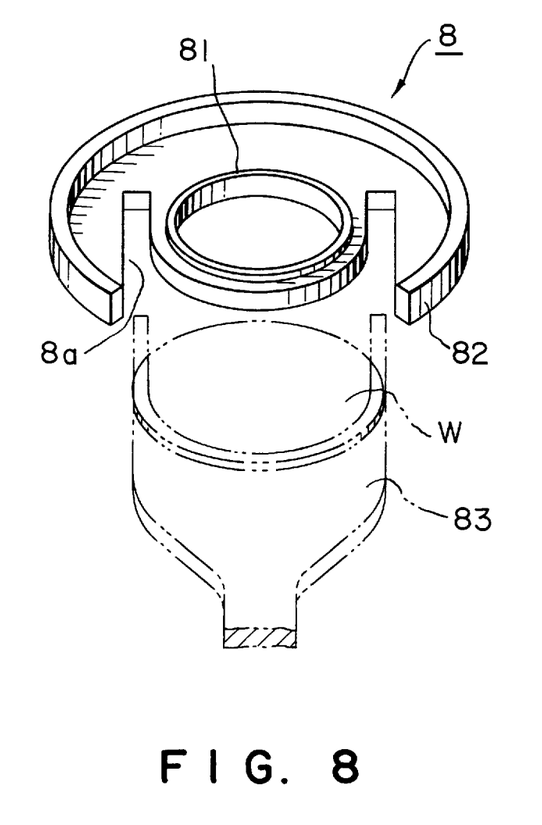
FIG. 8 is a perspective views showing still another embodiment of the wafer support member shown in FIG. 3.

Still another embodiment of the present invention will be described hereinafter with reference to FIG. 8. In this embodiment, as a wafer support member 8, an annular projection 81 is provided along the inner peripheral edge thereof, and a notch 8*a* of the size enough for a carrying arm 83 to enter leaving the projection 81 is formed in a part of a ring 80 provided with a wall 82 along the outer peripheral edge thereof.

In the case where such a wafer support member 8 is used, the wafer W is moved in from the notch 8*a* of the wafer support member 8 to a portion directly above the wafer support member 8 within the wafer boat by the carrying arm 83. Then, the carrying arm is moved down relative to the wafer boat whereby the wafer W is delivered to the wafer support member 8 of the wafer boat. Accordingly, in this wafer support member 8, since it is not necessary to move the wafer boat to a separate area, the transfer operation of the wafer W can be done simply and in a short period of time.

According to the present invention, since the substrate to be processed is supported at the position inwardly of the outer peripheral edge of the substrate to be processed by the projection of the support member, the substrate to be processed is supported by the projection despite the presence or absence of a warp of the substrate to be processed. As a result, since the support point of the substrate to be processed is always one-sided inwardly of the outer peripheral edge, the stress caused by the own weight of the substrate to be processed is small and the occurrence of the slip can be reduced. This is effective particularly in the case where the size of the substrate to be processed is larger and the own weight thereof is large. Further, when the wall is provided on the outer peripheral edge of the support member, the temperature difference between the peripheral edge and the center portion of the substrate to be processed is small so that the occurrence of the thermal strain stress is suppressed, and the occurrence of the slip can be further reduced.

What is claimed is:

1. A boat for heat treatment in which ring-shaped support members are provided in a vertically spaced relation on a plurality of upright columns, a substrate to be processed is supported on one of these ring-shaped support members which carries the substrate into and out of a vertical type heat treatment furnace, wherein each of said ring-shaped support members has an upwardly projecting annular projection provided at a position where the ring-shaped support member supports a part inwardly of an outer peripheral edge of the substrate to be processed, whereby the substrate to be processed is evenly supported by the annular projection.

2. The boat for heat treatment according to claim 1, wherein an outer wall higher than the upper surface of the substrate to be processed is formed along the outer peripheral edge of each said support member.

3. The boat for heat treatment according to claim 1, wherein said annular projection is formed only in the inner peripheral edge of each said support member.

4. The boat for heat treatment according to claim 1, wherein said annular projection is secured by three support rods extending inwardly from positions equally divided into three in the peripheral direction from a ring about a peripheral edge of each of said ring-shaped members.

* * * * *